United States Patent
Gower et al.

(10) Patent No.: US 8,379,459 B2
(45) Date of Patent: Feb. 19, 2013

(54) MEMORY SYSTEM WITH DELAY LOCKED LOOP (DLL) BYPASS CONTROL

(75) Inventors: Kevin C. Gower, LaGrangeville, NY (US); Lisa C. Gower, legal representative, LaGrangeville, NY (US); Kyu-Hyoun Kim, Mount Kisco, NY (US); Warren E. Maule, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 313 days.

(21) Appl. No.: 12/840,879

(22) Filed: Jul. 21, 2010

(65) Prior Publication Data

US 2012/0020171 A1    Jan. 26, 2012

(51) Int. Cl.
*G11C 7/00* (2006.01)
*G11C 8/00* (2006.01)

(52) U.S. Cl. .................. 365/189.05; 365/193; 365/194; 365/233.1; 365/233.12

(58) Field of Classification Search ............. 365/189.05, 365/193, 194, 233.1, 233.12, 233.17
See application file for complete search history.

(56) References Cited

U.S. PATENT DOCUMENTS

| | | | |
|---|---|---|---|
| 6,462,998 B1 * | 10/2002 | Proebsting | 365/194 |
| 6,757,212 B2 * | 6/2004 | Hamamoto et al. | 365/189.05 |
| 7,054,215 B2 * | 5/2006 | Kwon et al. | 365/194 |
| 7,248,512 B2 * | 7/2007 | Shin | 365/194 |
| 7,345,948 B2 * | 3/2008 | Oh | 365/194 |
| 7,394,721 B1 * | 7/2008 | Vemula | 365/233.1 |
| 7,437,500 B2 * | 10/2008 | Butt et al. | 365/189.05 |
| 7,715,253 B2 * | 5/2010 | Kim et al. | 365/193 |
| 7,746,723 B2 | 6/2010 | Oh et al. | |
| 7,865,661 B2 * | 1/2011 | Butt et al. | 365/189.05 |
| 7,868,648 B2 * | 1/2011 | Lee et al. | 365/189.05 |
| 8,023,358 B2 * | 9/2011 | Kim et al. | 365/233.1 |
| 8,134,877 B2 * | 3/2012 | Nagata | 365/194 |

* cited by examiner

*Primary Examiner* — Trong Phan
(74) *Attorney, Agent, or Firm* — Cantor Colburn LLP

(57) ABSTRACT

A memory system with delay locked loop (DLL) bypass control including a method for accessing memory that includes receiving a memory read command at a memory device. The memory device is configured to operate in a DLL off-mode to bypass a DLL clock as input to generating a read clock. A DLL power-on command is received at the memory device and in response to receiving the DLL power-on command a DLL initialization process is performed at the memory device. The memory read command is serviced at the memory device operating in the DLL off-mode, the servicing overlapping in time with performing the DLL initialization process. The memory device is configured to operate in a DLL on-mode to utilize the DLL clock as input to generating the read clock in response to a specified period of time elapsing. The specified period of time is relative to receiving the DLL power-on command.

20 Claims, 4 Drawing Sheets

MEMORY SYSTEM WITH DELAY LOCKED LOOP (DLL) BYPASS CONTROL

BACKGROUND

The present invention relates to memory systems, and more specifically, to delay locked loop (DLL) bypass control circuitry for use in a memory system.

As processor speeds continue to increase, memory performance becomes more of a limiting factor in system performance and therefore, memory performance must increase as well. An important aspect of increasing memory performance is increasing the speed at which data can be transmitted between elements (e.g., memory device, memory controller) in the memory system. In a typical memory system, synchronous communication is used to achieve high data transmission rates to and from the memory devices. Memory systems that communicate synchronously use a clock signal as a timing reference so that data can be transmitted and received with a known relationship to this reference. A difficulty in maintaining this relationship is that process, voltage, and temperature variations can alter the timing relationship between the clock and data signals, resulting in reduced timing margins. This problem can get worse as signaling speeds increase and may impact the ability of systems to communicate data at higher speeds.

Clock synchronous circuits such as phase lock loops (PLLs) and DLLs are typically used for maintaining the timing relationship between clock and data signals in a memory system. If the reference (or external) clock signal is different in frequency from an internal clock signal used to drive the data signals, then it is necessary to employ a frequency multiplying function, such as that provided by a PLL circuit. If the external clock signal is equal in frequency to the internal clock signal, then a DLL circuit is typically used to synchronize the internal clock signal used for inputting/outputting the data with the external clock signal.

A drawback to the use of DLLs is that they take a relatively large number of clock cycles to power-up once they have been turned off. This power-up delay time in DLLs contributes to an increased latency in memory access time. To avoid a DLL power-up delay from being added to memory access latency, a DLL may be left running (i.e., powered-on) when a memory device is in a reduced power mode, such as a standby mode. However, when the DLL is left running during standby mode, the DLL consumes a relatively large portion of the power required during memory standby, thus reducing power savings that can be achieved by putting a memory device in a low power mode.

Accordingly, and while existing memory systems may be suitable for their intended purpose, there remains a need in the art for memory systems that overcome these drawbacks.

SUMMARY

An embodiment is a method for accessing memory that includes receiving a memory read command at a memory device, the memory device including a delay locked loop (DLL) for generating a DLL clock. The memory device is configured to operate in a DLL off-mode to bypass the DLL clock as input to generating a read clock. A DLL power-on command is received at the memory device and in response to receiving the DLL power-on command, a DLL initialization process is performed at the memory device. The memory read command is serviced at the memory device, the servicing overlapping in time with performing the DLL initialization process. The servicing is performed by the memory device operating in the DLL off-mode, and the servicing includes utilizing the read clock for capturing read data. The memory device is configured to operate in a DLL on-mode to utilize the DLL clock as input to generating the read clock in response to a specified period of time elapsing. The specified period of time is relative to receiving the DLL power-on command.

Another embodiment is a memory system including a memory device that is configured to operate in a DLL off-mode to bypass a DLL clock as input to generating a read clock. The memory device includes a delay locked loop (DLL) in a power-off state for outputting the DLL clock in an unlocked state. The memory device also includes a command interface for receiving a DLL power-on command. The DLL power-on command includes instructions for performing a DLL initialization process to generate a DLL clock in a locked state and instructions for configuring the memory device in a DLL on-mode to utilize the DLL clock as input to generating the read clock. The memory device further includes latency circuitry for delaying configuring the memory device in the DLL on-mode until after a specified period of time has elapsed, the specified period of time relative to receiving the DLL power-on command. In this manner, the memory device is configured for servicing a memory read command in the DLL off-mode while the DLL initialization process is being performed.

A further embodiment is a method for accessing memory that includes receiving a memory read request at a memory controller, the memory read request corresponding to a memory device that is configured in a DLL off-mode. A memory read command is transmitted to the memory device in response to the memory controller receiving the memory read request. An expected data return time for the memory read command is calculated based on the memory device being configured in the DLL off-mode. A DLL power-on command is transmitted to the memory device, the DLL power-on command specifying a period of time to wait between receiving the DLL power-on command and configuring the memory device to operate in a DLL on-mode. An expected DLL power-on command completion time is calculated based on an initialization process performed by the memory device in response to receiving the DLL power-on command overlapping in time with servicing the memory read request at the memory device.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

An embodiment provides for a delay between issuing a command to power-on a delay locked loop (DLL) on a memory device, and configuring the memory device to use a clock generated by the DLL as a read clock for outputting data from the memory device. An embodiment allows memory accesses to continue in a DLL-off mode by using an external clock (also referred to herein as a "reference clock") that has not been processed by the DLL as a read clock to launch read data while the DLL is being initialized. Once the DLL initialization process has been completed and the DLL clock is stable, subsequent memory access are performed in a DLL-on mode by using the DLL generated clock as the read clock. In another embodiment, the memory device operates in DLL-off mode for a specified period of time after the DLL power-on command is received and then the memory device waits to transmit additional read data in DLL-on mode until the DLL initialization process is complete. Embodiments allow a memory read to be serviced at a memory device while the DLL initialization process is being performed at the memory device (i.e., they overlap in time).

An embodiment provides a way to fast switch between a DLL on-mode (DLL clock is used as input to generate a read clock) and a DLL off-mode (DLL clock is not used as input to generate a read clock) by allowing a first access to a memory device to be performed in DLL off-mode and hiding the DLL wakeup time (when the initialization process is being performed) behind the time for other rank accesses. In an embodiment, upon the first access to a memory device in a rank in which the DLL is turned off, the memory controller continues to access the memory device in a DLL off-mode. Also, upon the first access to the memory device, a memory controller issues a DLL power-on command to begin a DLL initialization process on the DLL on the memory device. The delay between issuing the DLL power-on command and accessing the memory device in a DLL on-mode may be set to allow a specified number of transactions (e.g., one read) to be processed at a lower transaction speed supported by the DLL off-mode. In another embodiment, the delay is set based on an expected completion time of the DLL initialization process. The delay is programmable and may be set to any measurable time frames (clock cycles, milliseconds, etc.) and/or event completions (e.g., a read transaction in DLL off-mode completes, particular step in the DLL initialization completes) in the memory device.

Figure 1:
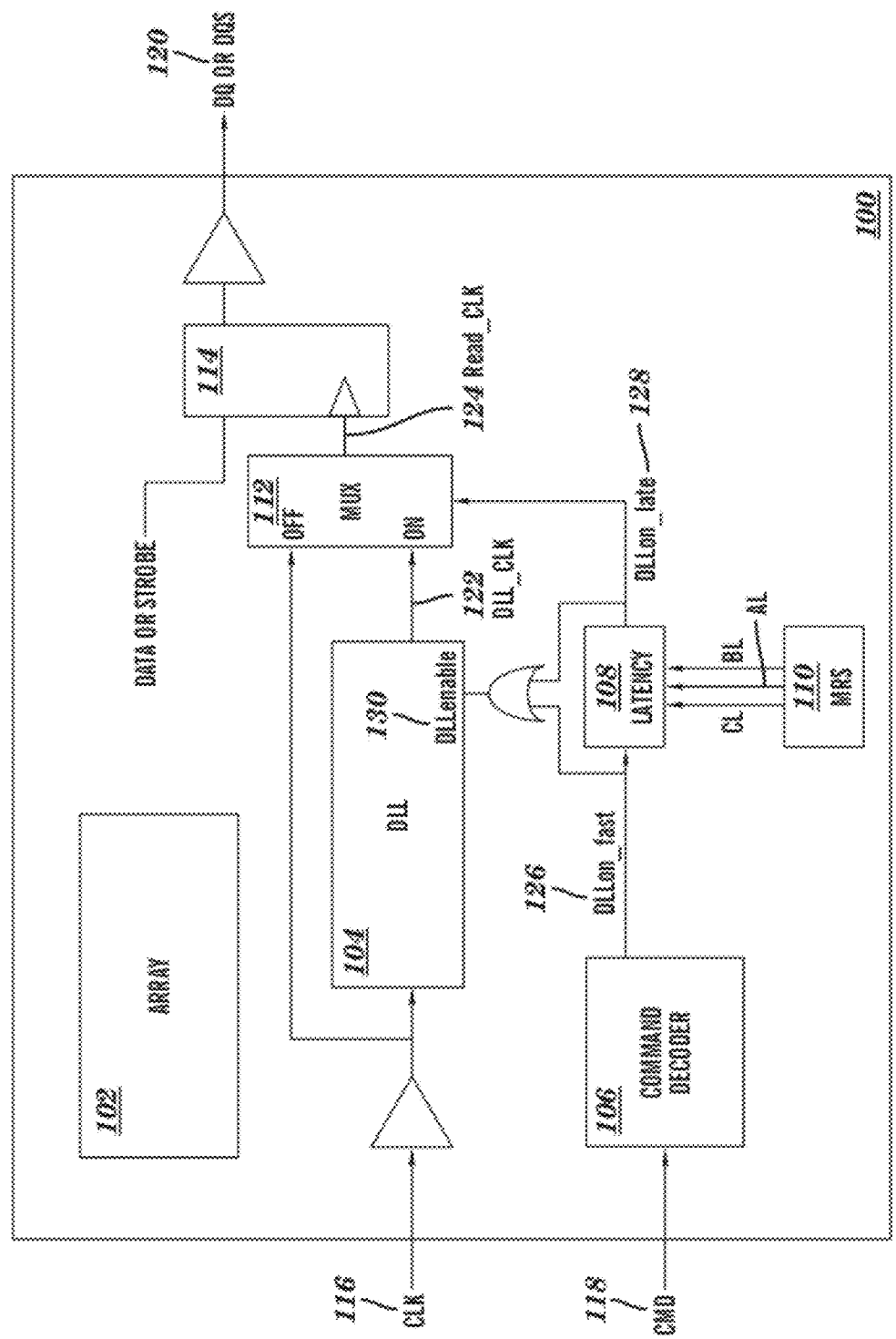
FIG. 1 depicts a memory device with DLL bypass control circuitry in accordance with an embodiment.

Turning now to FIG. 1, the memory device 100 includes a memory array 102 of memory cells for storing data, a DLL 104, a command decoder 106, mode register select (MRS) circuitry 110, latency logic 108, a multiplexer (MUX) 112, and a transmitter 114 for clocking data out of the memory device 100 in response to a DATA OR STROBE signal.

When it is operational (e.g., DLL is powered-on and the memory device is in DLL on-mode), the DLL 104 aligns a reference clock 116 with a data strobe signal (DQS) to generate a DLL_CLK 122. As described herein, it is assumed that the DQS and the DQs are aligned with each other. As factors such as voltage and temperature vary, the timing characteristics of the output logic and output driver change and may cause the data valid window to shift relative to the reference clock 116. In order to support data transmission and receipt at high speeds, timing variations between the DQS, DQ and the reference clock 116 clock should be as small as possible to provide as large a data valid window as possible for clocking out the read data. The DLL 104 minimizes the variations between the DQS (and therefore also the DQ) by continuously comparing the relationship between the DQS and the reference clock 116 and providing feedback to adjust and maintain a fixed relationship between them.

The DLL 104 depicted in FIG. 1 may be implemented by any DLL known in the art (e.g., a digital DLL, a DLL that utilizes physical delay lines, etc.). In an embodiment, the DLL 104 is implemented by a DLL that contains circuits which mimic the behavior of output logic and drivers to model and estimate the phase differences between the DQS and the reference clock 116. In another embodiment, the DQS is input to the DLL 104 to estimate phase differences. Once any phase differences are estimated, the DLL 104 adjusts the phase of the reference clock 116 to better align its phase with the DQS and DQ signals.

In an embodiment, the command decoder 106 receives a DLL power-on command from a memory controller via a command interface 118. In an embodiment, the DLL power-on command causes the DLL 104 to begin a DLL power-on process while the memory device 100 continues to perform memory reads in a DLL off-mode. Thus, memory reads do not have to wait until the DLL power-on process has completed in order to service incoming memory read commands. When the DLL power-on command is received, the DLLon_fast signal 126 sets the DLLenable 130 to cause the DLL 104 to begin the DLL power-on process. In addition, the DLLon_fast signal 126 is sent to the latency logic 108. The latency logic includes hardware and/or software controls for delaying configuring the memory device 100 in DLL on-mode for a specified period of time (specified, for example, in milliseconds or clock cycles). In the embodiment depicted in FIG. 1, data stored in the MRS circuitry 100, such as, but not limited to cache latency (CL), additive latency (AL), and/or burst length (BL) are input to the latency logic 108 to determined the length of the specified delay period.

When the specified period of time has elapsed, as determined by the latency logic 108, the DLLon_late signal 128 is generated and used to configure the memory device 100 into DLL on-mode. When the DLLon_late signal 128 is received at the MUX 112, the clock output from the DLL 104, the DLL_CLK 122 is selected as the Read_CLK 124 and the memory device 100 is configured in DLL on-mode. Prior to the DLLon_late signal 128 being received at the MUX 112, memory device 100 is configured in the DLL off-mode with the reference clock 116 being selected as the Read_CLK 124. As shown in FIG. 1, the Read_CLK 124 is used as the clock to transmit that the DQ or DQS signals 120.

FIG. 1 is described in terms of the DLL power-on command being received via the command interface 118, however, the memory device 100 is also configured to perform typical memory operations such as, but not limited to, memory reads and memory writes. The operations are typically performed in response to a command via the command interface 118 from the memory controller or other memory element.

Figure 2:
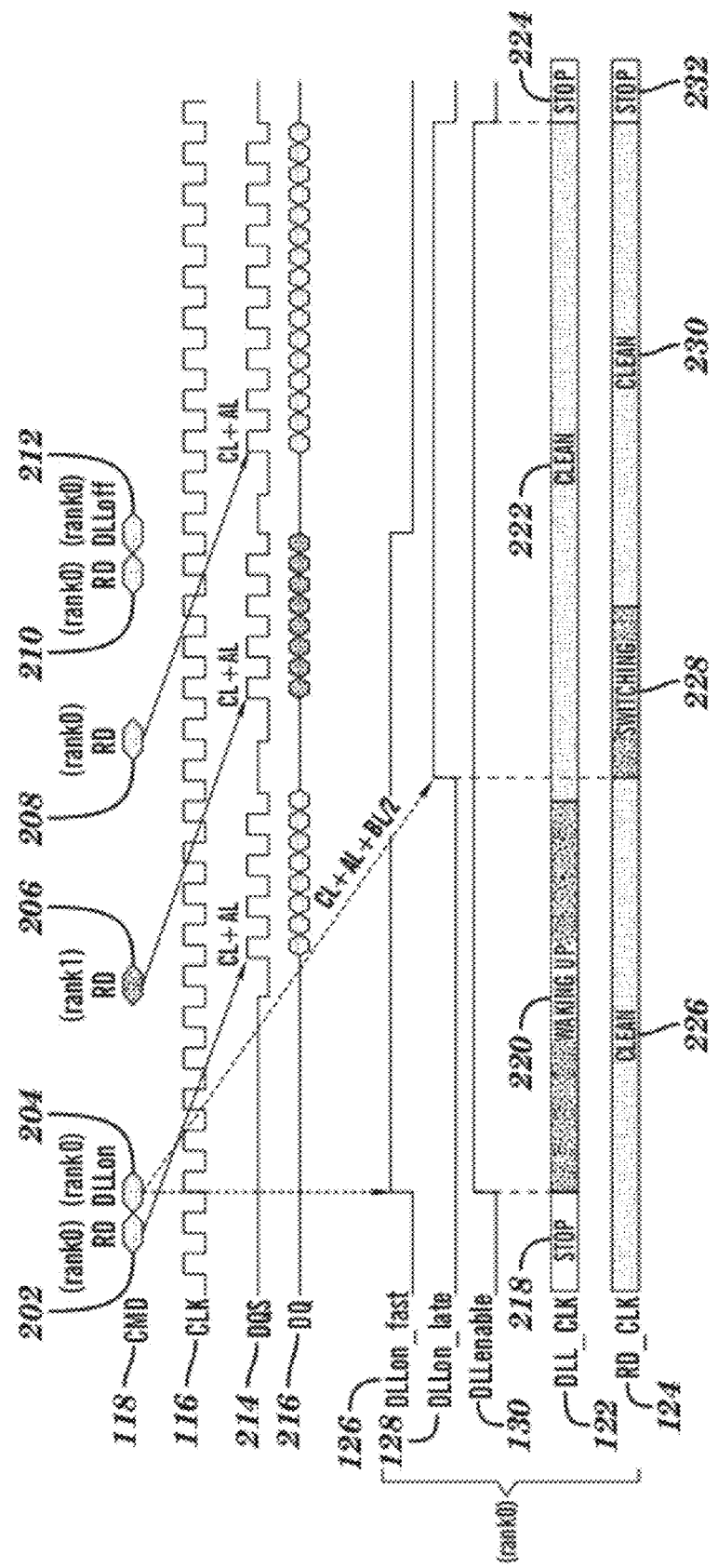
FIG. 2 depicts a timing diagram that may be implemented by a memory device in accordance with an embodiment.

FIG. 2 depicts a timing diagram that may be implemented by a memory device in accordance with an embodiment. As shown in FIG. 2, a read command (RD) 202 is issued to a rank, rank0, of a memory device that is executing in the DLL off-mode (i.e., the DLL on the memory device is powered off, the DLL_CLK 122 is stopped 218 or not stable), followed by a DLL power-on command (DLLon) 204 being issued to the memory device at rank0. For ease of explanation, the following discussion describes processing occurring on a single memory device, the same principles apply when the processing occurs on multiple memory devices within one or more ranks. As shown in FIG. 2, the read command is serviced by the memory device and the data is sent on the DQS 214 in a DLL off-mode (CL+AL cycles after the read command (RD) 202 is issued), where the reference clock 116 has not been synchronized with the DQS 214. While the read command 202 is being serviced by the memory device, the DLL continues a DLL power-on process (i.e., the DLL_CLK 122 it is waking up 220 and is in an unlocked state) to better align the reference clock 116 and the DQS 214, resulting in the DLL_CLK 122. Also as shown in FIG. 2, the Read CLK 124 is clean, indicating that it can be used to drive read data.

In the embodiment depicted in FIG. 2, the specified period of time between when the DLL power-on command is received and the memory device begins to operate in a DLL on-mode is the amount of time that it takes one read command 202 in a DLL off-mode to complete. In this example, that number of cycles that the memory device continues to execute in DLL off-mode is equal CL+AL+BL/2 (to reflect two bits being captured in every clock cycle). Once the memory device is in DLL on-mode, it must wait until the DLL_CLK 122 has been locked (i.e., is clean 222) and the MUX 112 is done switching the Read_CLK 124 to use the DLL_CLK 122 in order to service another read command at the memory device.

As shown in FIG. 2, a read command (RD) 206 directed to a memory device operating in a DLL on-mode in a different rank (rank1) may be issued while the memory system (e.g., a memory controller) is waiting to issue another read command to the memory device performing the DLL power-on process.

Once the DLL power-on process is completed (i.e., the DLL_CLK 122) and the memory device has been configured to operate in the DLL on-mode (i.e., the Read_CLK 124 is done switching 228 and is clean 230), any additional read commands (RD) 208, 210 are issued to the memory device. Both read command (RD) 208 and read command (RD) 210 are on rank0. For the additional read commands (RD) 208, 210, where the system is operating in a high speed mode, there are no gaps between the returned data on the DQ 216. In an embodiment, such as the one depicted in FIG. 2, once the reads are completed, a DLL off command (DLLoff) 212 is issued at rank0 to turn the DLL off and return the memory device to DLL off-mode with the DLL_CLK 122 stopped 224. In addition, the memory device may be placed in a standby mode or power-off mode where the Read_CLK 124 is stopped 232.

Figure 3:
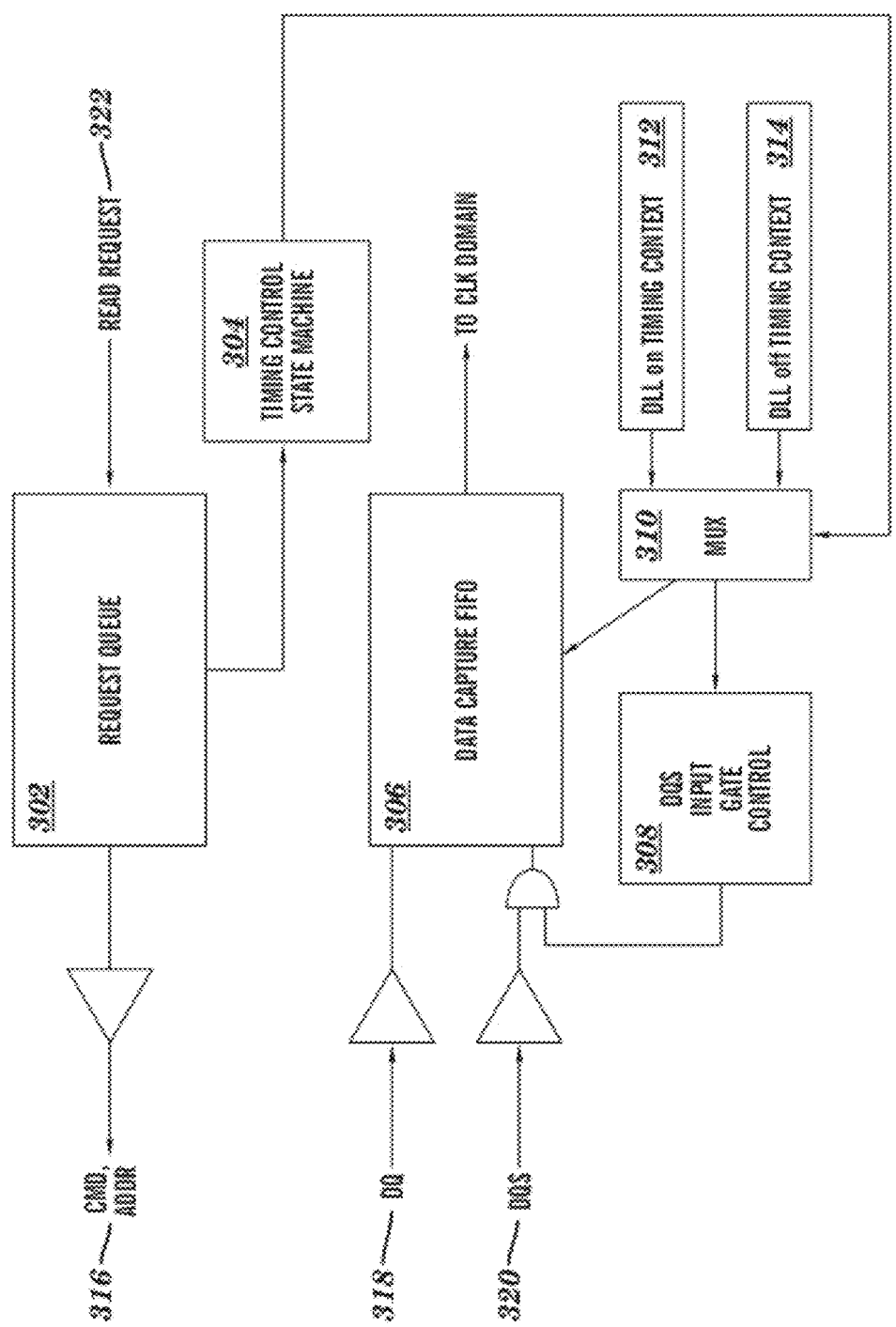
FIG. 3 depicts a memory controller in accordance with an embodiment for interfacing with a memory device with DLL bypass control circuitry.

FIG. 3 depicts a memory controller in accordance with an embodiment for interfacing with a memory device with DLL bypass control circuitry. The memory controller generates read request commands, and keeps track of outstanding read request commands including expected data return times. The memory controller depicted in FIG. 3 includes a request queue 302 for storing read requests 322 (e.g., received from a processor) and for transmitting commands and address (CMD, ADDR) to one or more memory devices. The memory controller also includes a timing control state machine 304 for storing information about latency/expected data return times. Data in the timing control state machine 304 may be used to calculate expected data return times. In an embodiment, the timing control state machine 304 stores the specified time period between a memory device in DLL off-mode receiving a DLL power-on command and the memory device being re-configured to operate in DLL on-mode. In an embodiment, the expected data return time (i.e., latency) when the memory device is configured in DLL off-mode is longer (i.e., data is returned at a later time) than when the memory device is configured in DLL on-mode.

The memory controller depicted in FIG. 3 also includes a data capture buffer 306 (in this embodiment, a first in first out or "FIFO buffer") for capturing data on the DQ interface 318 using the DQS 320. In addition, the memory controller includes a DQS input gate control 308 that generates a signal that is input to the data capture FIFO 306 to control the timing of data captured on the DQ interface 318 using the DQS 320. Output from the DQS input gate control 308 indicates when data is expected to be received on the DQ interface 318 based on whether the memory device is configured in a DLL on-mode or a DLL off-mode. As shown in FIG. 3, either a DLL on timing context 312 for data received from memory devices in a DLL on-mode or a DLL off timing context 314 for data received from memory devices in a DLL off mode is selected by the MUX 310 for input to both the data capture FIFO 306 and the DQS input gate control 308.

Figure 4:
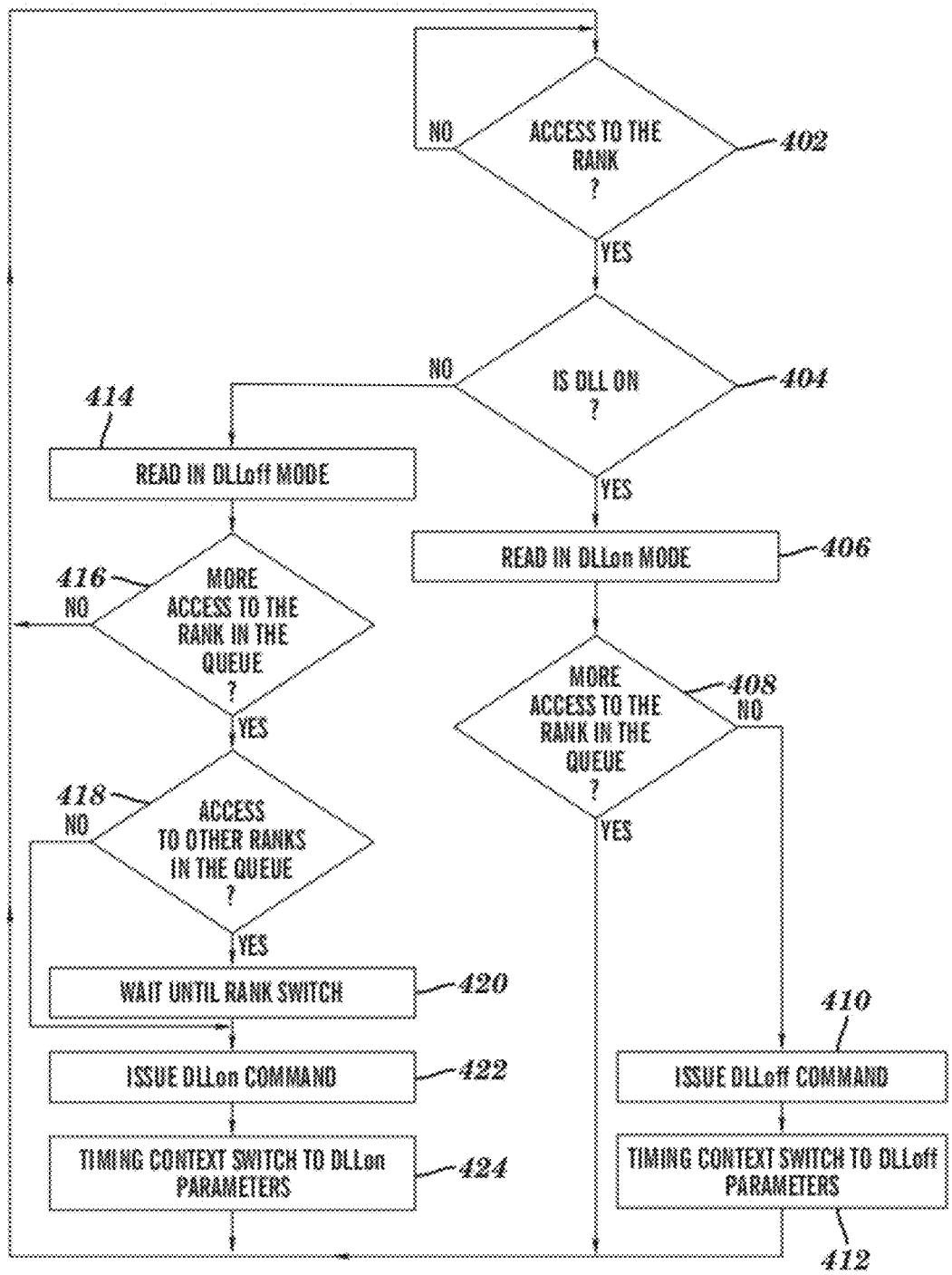
FIG. 4 depicts a process flow implemented by a memory controller in accordance with an embodiment.

FIG. 4 depicts a process flow implemented by a memory controller in accordance with an embodiment where all memory devices within a rank are in DLL on-mode or all are in DLL off-mode. At block 402, it is determined if a memory read request is pending for a particular rank. If there is a pending read request for the rank, then block 404 is performed to determine if the memory devices within the rank are in DLL on-mode. If the memory devices are in DLL on-mode, then block 406 is performed and read commands are issued for the memory devices and the expected data return time is based on the memory devices being in DLL on-mode. At block 408, it is determined if there are more requests to access the rank in the request queue 302. If there are, then processing continues at block 402. If there are not more access requests directed to the current rank, then at block 410 the memory devices within the queue are put into a low power mode (e.g., standby, power off) and a command is issued to the memory devices in the rank to turn the DLLs off (e.g., configure the memory devices to operate in DLL off-mode). At block 412, the MUX 310 switches to select a DLL off timing context 314. Processing continues at block 402.

If, at block 404, it is determined that the DLL is not turned off, then block 414 is performed and read commands for are issued for the memory devices and the expected data return time is based on the memory devices being in DLL off-mode. At block 416, it is determined if there are more requests to access the rank in the request queue 302. If there are no more requests to access the rank in the request queue 302, then processing continues at block 402. If there are more request to access the rank in the request queue, then processing continues at block 418. At block 418, it is determined if there are requests to access other ranks in the request queue 302. If there are no requests to access other rankst, then processing continues at block 422; if there are requests to access other ranks, then block 420 is performed to wait a number of cycles for a rank switch to occur and processing continues at block 422. At block 422, a DLLon command is issued to configure the memory devices to operate in DLL on-mode. Next, block 424 is performed and the MUX 310 switches to select a DLL on timing context 312. Processing continues at block 402.

Technical effects and benefits include the ability to improve memory throughput by not forcing a memory device to wait for a DLL power-on process to complete before servicing a memory read request command to the memory device. Therefore, there is less penalty in terms of throughput when a DLL has to be moved from a DLL off-mode into a DLL on-mode, making powering off the DLL a less expensive option in terms of latency. This may lead to power savings with DLLs being powered off more frequently.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Further, as will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A memory system comprising:
a memory device configured to operate in a DLL off-mode to bypass a DLL clock as input to generating a read clock, the memory device comprising:
a delay locked loop (DLL) in a power-off state for outputting the DLL clock in an unlocked state;
a command interface for receiving a DLL power-on command, the DLL power-on command including instructions for performing a DLL initialization process to generate a DLL clock in a locked state and for configuring the memory device in a DLL on-mode to utilize the DLL clock as input to generating the read clock; and
latency circuitry for delaying the configuring the memory device in a DLL on-mode until after a specified period of time has elapsed, the specified period of time relative to receiving the DLL power-on command, thereby allowing the memory device to service memory read commands in the DLL off-mode while the DLL initialization process is being performed.

2. The memory system of claim 1, wherein a second memory command received after the specified period of time has elapsed is serviced after the initialization process has completed.

3. The memory system of claim 1, wherein the DLL off-mode is characterized by the DLL clock not being locked.

4. The memory system of claim 1, wherein a memory read has a first latency when the memory device is configured to operate in the DLL off-mode and a second latency when the memory device is configured to operate in the DLL on-mode, the first latency longer than the second latency.

5. The memory system of claim 1, wherein the specified period of time is specified as a number of clock cycles.

6. The memory system of claim 1, wherein the specified period of time is selected to elapse prior to the DLL initialization process completing.

7. A method for accessing memory, the method comprising:
receiving a memory read command at a memory device, the memory device comprising a delay locked loop (DLL) for generating a DLL clock, and the memory device configured to operate in a DLL off-mode to bypass the DLL clock as input to generating a read clock;
receiving a DLL power-on command at the memory device;
performing a DLL initialization process at the memory device in response to receiving the DLL power-on command;
servicing the memory read command at the memory device, the servicing overlapping in time with performing the DLL initialization process and the servicing performed by the memory device operating in the DLL off-mode, the servicing comprising utilizing the read clock for capturing read data; and
configuring the memory device to operate in a DLL on-mode to utilize the DLL clock as input to generating the read clock, the configuring the memory device to operate in a DLL on-mode performed in response to a specified period of time elapsing, the specified period of time relative to receiving the DLL power-on command.

8. The method of claim 7, further comprising:
receiving a second memory read command after configuring the memory device to operate in the DLL on-mode; and
servicing the second memory read command after the initialization process has completed.

9. The method of claim 7, wherein the DLL initialization process comprises locking in the DLL clock to produce a stable DLL clock.

10. The method of claim 9, wherein the DLL initialization process further comprises aligning a reference clock with a data strobe signal to generate the DLL clock.

11. The method of claim 7, wherein the DLL off-mode is characterized by the DLL clock not being stable.

12. The method of claim 7, wherein a memory read has a first latency when the memory device is configured to operate in the DLL off-mode and a second latency when the memory device is configured to operate in the DLL on-mode, the first latency longer than the second latency.

13. The method of claim 7, wherein the specified period of time is specified as a number of clock cycles.

14. The method of claim 7, wherein the specified period of time is selected to elapse prior to the DLL initialization process completing.

15. A method for accessing memory, the method comprising:
receiving a memory read request at a memory controller, the memory read request corresponding to a memory device that is configured in a DLL off-mode;
transmitting a memory read command to the memory device in response to receiving the memory read request;
calculating an expected data return time for the memory read command responsive to the memory device being configured in the DLL off-mode;
transmitting a DLL power-on command to the memory device, the DLL power-on command specifying a period of time to wait between receiving the DLL power-on command and configuring the memory device to operate in a DLL power-on mode; and
calculating an expected DLL power-on command completion time, the calculating responsive to a DLL initialization processing performed in response to the DLL power-on command overlapping in time with servicing the memory read request at the memory device.

16. The method of claim 15, further comprising:
transmitting receiving a second memory read command to the memory device after the specified period of time has elapsed; and
calculating an expected data return time for the second memory read command responsive to the memory device waiting to service the second memory read command until after the DLL initialization processing has completed and to the memory device being configured in a DLL power-on mode.

17. The method of claim 15, wherein the DLL initialization processing comprises locking in a DLL clock for use as a read clock.

18. The method of claim 15, wherein memory read commands have a first expected latency when the memory device is configured to operate in the DLL off-mode and a second expected latency when the memory device is configured to operate in the DLL on-mode, the first expected latency longer than the second expected latency.

19. The method of claim 15, wherein the specified period of time is specified as a number of clock cycles.

20. The method of claim 15, wherein the specified period of time is selected to elapse prior to the DLL initialization processing being completed.

* * * * *